United States Patent [19]
Shi et al.

[11] Patent Number: 5,977,704
[45] Date of Patent: *Nov. 2, 1999

[54] ORGANIC ELECTROLUMINESCENT DISPLAY WITH ICONS

[75] Inventors: Song Shi, Phoenix; Franky So, Tempe, both of Ariz.; H.C. Lee, Calabasas, Calif.

[73] Assignee: Motorola, Inc., Schaumburg, Ill.

[ * ] Notice: This patent is subject to a terminal disclaimer.

[21] Appl. No.: 08/739,468

[22] Filed: Oct. 28, 1996

[51] Int. Cl.[6] ............................... H01J 1/62; H01J 63/04
[52] U.S. Cl. .................... 313/504; 313/500; 313/505; 313/506; 313/510
[58] Field of Search .................................. 313/503, 504, 313/506, 509, 500, 501; 345/75, 76

[56] References Cited

U.S. PATENT DOCUMENTS

| | | | |
|---|---|---|---|
| 5,015,999 | 5/1991 | Imai et al. | 340/702 |
| 5,126,214 | 6/1992 | Tokailin et al. | 313/503 X |
| 5,294,870 | 3/1994 | Tang et al. | 313/504 |
| 5,680,160 | 10/1997 | LaPointe | 345/76 |
| 5,705,285 | 1/1998 | Shi et al. | 313/504 |

*Primary Examiner*—Sandra O'Shea
*Assistant Examiner*—Mack Haynes
*Attorney, Agent, or Firm*—Eugene A. Parsons; William E. Koch

[57] ABSTRACT

An organic electroluminescent display device (10) includes a first display region (12) and a second display region (14), each region adapted to provide a different type of information. For example, first display region (12) may be adapted to display icon information, while second display region (14) may be adapted to provide dynamic or changing information such as video or alpha numeric information. The display device (10) may include an organic electroluminescent display module (62) having a plurality of picture elements, said picture elements optionally having corresponding light influencing elements (58 and 102–110) for providing full color icon or dynamic information.

3 Claims, 1 Drawing Sheet

5,977,704

ORGANIC ELECTROLUMINESCENT DISPLAY WITH ICONS

TECHNICAL FIELD

This invention relates in general to flat panel information display devices and in particular to light emitting organic electroluminescent information display devices with color icons.

BACKGROUND OF THE INVENTION

Until fairly recently, the preferred, indeed the only means by which to display information in the electronic medium was to use a video monitor comprising a cathode ray tube ("CRT"). CRT technology has been well known for over 50 years, and has gained widespread commercial acceptance in applications ranging from desktop computer modules to home televisions and industrial applications. CRTs are essentially large vacuum tubes having one substantially planar surface upon which information is displayed. Coated on the inside of the CRT planar surface is a layer of phosphors which respond by emitting light when struck by electrons emitted from the electron gun of the CRT. The electron gun is disposed in an elongated portion which extends away from the inside of the CRT display surface.

While CRTs are widely used in numerous applications, there are several inherent limitations to the application of CRT technology. For example, CRTs are relatively large and consume a great deal of energy. Moreover, as they are fabricated of glass, the larger the display surface, the heavier the CRT. Given the need for the electron gun to be spacedly disposed from the phosphors surface of the display surface, CRTs have a substantial depth dimension. Accordingly, CRTs have little use in small and portable applications, such as handheld televisions, laptop computers, and other portable electronic applications which require the use of displays.

To answer the needs of the marketplace for smaller, lighter, more portable display devices, manufacturers have created numerous types of flat panel display devices. Examples of flat panel display devices include active matrix liquid crystal displays (AMLCD's), plasma displays, and electroluminescent displays. Each of these types of displays has use for a particular market application, though each is accompanied by various limitations which make them less than ideal for certain applications. Principal limitations inherent in devices such as AMLCD's relate to the fact that they are fabricated predominantly of inorganic semiconductor materials by semiconductor fabrication processes. These materials and processes are extremely expensive, and due to the complexity of the manufacturing process, cannot be reliably manufactured in high yields. Accordingly, the costs of these devices are very high with no promise of immediate cost reduction.

One preferred type of device which is currently receiving substantial research effort is the organic electroluminescent device. Organic electroluminescent devices ("OED") are generally composed of three layers of organic molecules sandwiched between transparent, conductive and/or metallic conductive electrodes. The three layers include an electron transporting layer, an emissive layer, and a hole transporting layer. Charge carriers specifically, electrons and holes, are generated in the electron and hole transporting region. Electrons are negatively charged atomic particles and holes are the positively charged counterparts. The charge carriers are injected into the emissive layer, where they combine, emitting light. OED's are attractive owing to their thin profile, light weight, and low driving voltage, i.e., less than about 20 volts. Hence, they have a potential application as full color flat emissive displays.

Small to medium size displays with diagonal viewing dimensions of less than about four inches are in great demand for portable applications such as video cameras, digital cameras, personal digital assistants, personal handy phones, cellular phones, and a host of other devices which require low power, lightweight, and multi-colored direction. In many such applications, icons, especially color icons, have been used along with a main display to indicate the miscellaneous information relative to the device, examples of which include operation mode, the signal carrier, power indicators, alarm codes, and others. For those applications where color icons are required in addition to dynamic or varying information, the practice has been to combine a standard AMLCD as the main display with light emitting diodes (LED's) as the color icons. Due to the limitations of viewing angle and night visibility with AMLCD's and the high cost and high power drain associated with LED's, this solution has been less than optimal. Moreover, the manufacturing difficulty of combining two or more types of display device results in significantly lower manufacturing yields and hence higher prices.

Accordingly, there exists a need for an emissive display which provides both color iconic information as well as dynamic, varying information in a traditional display format. Such a display device should have low power drain, wide viewing angle, good night visibility, and be both low cost and highly manufacturable.

DETAILED DESCRIPTION OF THE PREFERRED EMBODIMENT

Figure 1:
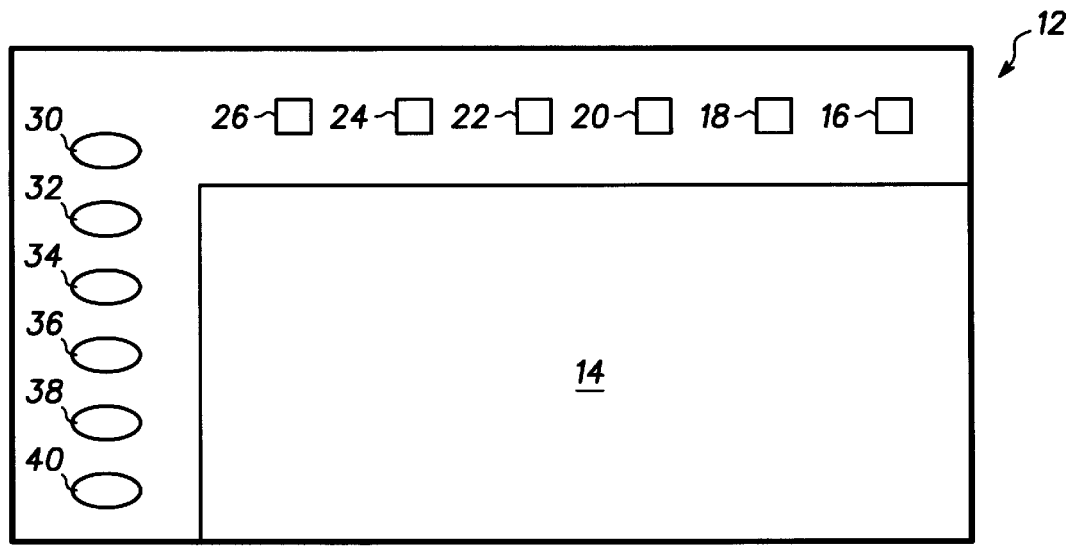
FIG. 1 is a plan view of an organic electroluminescent display device having color icons in accordance with the instant invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is illustrated therein a front plan view of an organic electroluminescent display device (10) having a first display region 12 for displaying static, unchanging information, such as icon information, and a second display region 14 for displaying varying information. The first and second display regions are integrally formed in a single display device. The first display region 12, as illustrated in FIG. 1, is disposed about a portion of the periphery of the display device 10, and includes at least one and preferably a plurality of icon displays 16, 18, 20, 22, 24, 26, 30, 32, 34, 36, 38, and 40. The information displayed by the icons (either color or monochromatic) 16–40 is substantially static or non-varying, except to the extent that the icon may either be illuminated or not illuminated. The information displayed by said display icons is in the nature of that described hereinabove, examples of which include, for example, but are not limited to, signal strength, on-off, battery life indicator, power indicator, signal strength, and combinations thereof. Each display icon 16–40 is comprised of one or more discrete display pixels which may be illuminated or dimmed in a manner well known to those of ordinary skill in the art.

The second display region 14 is, by contrast, adapted to display information which varies, such as alpha numeric information or video information. In this regard, the second region is fabricated of a plurality of display picture elements or pixels, arranged in an x by y matrix, and in sufficient number and density so as to provide a substantially video speed information display module.

Figure 2:
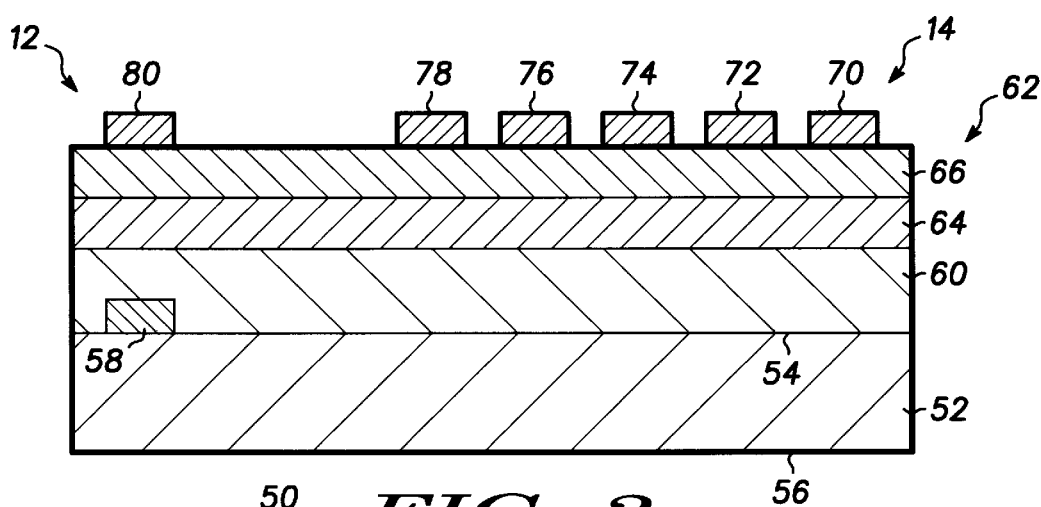
FIG. 2 is a cross-sectional side view of a monochrome OED display with color icons.

Referring now to FIG. 2, there is illustrated therein a cross-sectional side view of an organic electroluminescent display device such as that described hereinabove with respect to FIG. 1. The device 50 includes a first display substrate 52 which is transparent and which may be fabricated of any of a number of known materials employed in the art. Examples of materials from which the substrate 52 may be fabricated include, but are not limited to, glass, soda lime glass, transparent plastic substrates made of polyolefins, polyether sulfones, polyarylates, and combinations thereof. The substrate 52 has first and second major surfaces 54 and 56, wherein 56 is adapted to be the viewer proximal side of the display device 50.

Disposed atop first major surface 54 is at least one light influencing element 58. The light influencing element is adapted to change or otherwise alter the character of light passing therethrough. Accordingly, light influencing elements may be selected from a number of different types of devices adapted for such purpose, examples of which include light filters, polarizers, lenses such as fresnal lenses, elements which fluoresce a light in response to the absorption of a particular wave length of light incident thereon, and combinations thereof. In one preferred embodiment, light influencing element 58 is adapted to absorb light of a first color, and re-emit that light by fluorescing a second color. Thus, for example, light influencing element 58 may be adapted to absorb blue or blue green light, and re-emit red light in response to said absorbed light.

Disposed atop the light influencing element 58 and on the first major surface 54 of substrate 52, is a layer of a spacing, insulating, planarizing material 60. The spacing layer is provided so as to insure a relatively smooth surface on which a subsequently disposed organic electroluminescent display device can be positioned. The layer 60 also protects the underlying light influencing element 58 from being damaged or deformed during any subsequent fabrication processes. As is well known in the art, such a device must be fabricated upon an appropriate substrate in order to ensure that it will work properly. In this regard, the spacing layer 60 is fabricated of any of a number of materials known in the art, preferred examples of which include organic monomers or polymers which may be polymerized and/or cross-linked after deposition in order to generate a rigid surface. Alternatively silicon oxide prepared by sol gel process can be used as the spacing layer.

Disposed atop the layer of spacing material 60 on the side thereof opposite the light influencing element 58 is an organic electroluminescent display device 62. The OED includes a first layer of a transparent conductive material 64 fabricated of a thin layer of a transparent conducting material, examples of which include indium tin oxide, indium oxide, tin oxide, zinc oxide, vanadium oxide, and combinations thereof. Alternatively, the layer 64 maybe fabricated of thin, i.e., less than 500 Å, layer of a semi-transparent metallic material such as nickel, chromium, copper, silver, and combinations thereof. Layer 64 is adapted to serve as the first electrode of the organic electroluminescent display device.

Thereafter deposited atop layer 64 is at least one layer of an organic electroluminescent display material. As is well known to those of ordinary skill in the art, such device may include a plurality of layers or material including, for example, a hole injecting layer, a hole transport layer, an emitter layer, an electron transport layer, and an electron injecting layer. Each of these layers is fabricated of one or more types of organic or polymeric materials well known to those of ordinary skill in the art. Exemplary hole injecting materials are disclosed in, for example, U.S. Pat. Nos. 3,935,031 and 4,356,429. Similarly, representative hole transporting materials are disclosed in U.S. Pat. Nos. 4,175, 960, 4,539,507, and in commonly assigned, copending patent application Ser. No. 08/660,014, now U.S. Pat. No. 5,668,438, filed in the names of Song Shi, et al, the disclosure of which is incorporated herein by reference. Emitter materials are disclosed in, for example, U.S. Pat. Nos. 5,150,006, 5,061,569, and commonly assigned copending, U.S. patent application Ser. No. 08/304,451 filed Sept. 12, 1994, the disclosure of which is incorporated herein by reference. Finally, electron transporting materials may be fabricated and may be selected of the group of materials disclosed in U.S. Pat. Nos. 4,769,292 and 5,529,853 as well as aforementioned U.S. patent application Ser. No. 08/304, 451, the disclosures of which are incorporated herein by reference.

Thereafter deposited atop a layer or layers of the organic electroluminescent material 66 are a plurality of discrete electrodes which define the first and second display regions 12 and 14 respectively. More particularly, the second display region is defined by a plurality of display electrodes 70, 72, 74, 76, and 78, while the first display region corresponding to the icon display region includes an icon electrode 80 which corresponds to, for example, icon 40 of FIG. 1. Each electrode may further define a discrete picture element or pixel. When an electric current is passed between layers 64 and one or more of electrodes 70–80 a light will be emitted by the layers of organic electroluminescent material 66 in the organic electroluminescent display module 62, in a manner well known to those of ordinary skill in the art.

As may be appreciated from a perusal of FIG. 2, the display device illustrated therein is a color display device with respect to the icons, while it is a monochrome display device with respect to the region display varying information 14. This is due to the fact that light emitted from the icon displaying region 12 is absorbed by light influencing element 58 so as to emit light of a different color than that being emitted by the OED device. Conversely, as the electrodes 70–78 are not disposed adjacent a light influencing element, information displayed by such pixel is a single color and thus provides a monochrome display.

In this display device, the light influencing element 58 is preferred to fluoresce light of wavelength range of between 5500 and 7000 Å upon absorbing light of wavelength range of between 4000 and 5500 Å, which is in the visible range of yellow, orange and red. Also the electroluminescence materials 66 in the OED device 62 are selected so that the resulting OED emits light having wavelength of between 4000 and 5500 Å, which is in the visible range of blue, bluish-green, green. Thus the display system comprises a main monochrome display with color in blue to green region and multicolor icons with color ranging from yellow to red.

Figure 3:
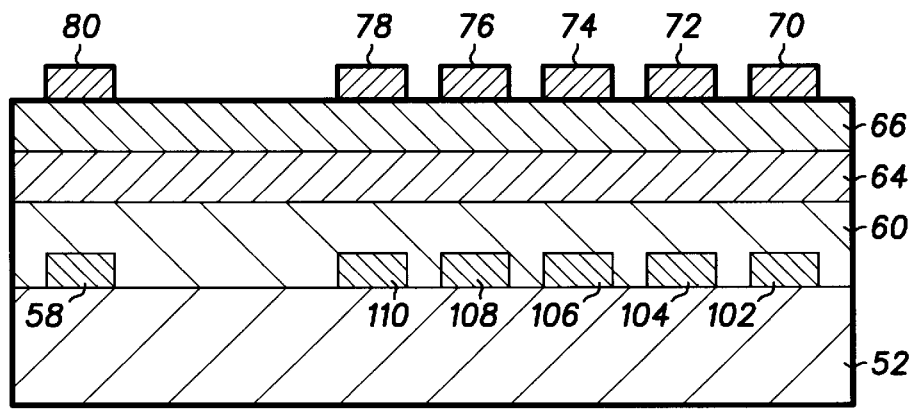
FIG. 3 is a cross-sectional side view of a multi-color OED display with color icons in accordance with the instant invention.

Alternatively, and as maybe appreciated from a perusal of FIG. 3, the display device 100 may include a plurality of light influencing elements 58, 102, 104, 106, 108, and 110. In this embodiment, light influencing element 58 is disposed substantially adjacent to the pixel defined by electrode 80, while light influencing elements 102–110 are disposed adjacent the pixels defined by electrodes 70–78 respectively. In the embodiment of FIG. 3, light influencing elements 102–110 may be selected from the group of elements described hereinabove with respect to light influencing element 58. Accordingly, such light influencing elements may be adapted to display a number of different optical effects depending upon the application desired.

In one preferred embodiment, the pixels are picture elements defined by electrodes 70, 72, 74, 76, 78, and 80 are adapted to emit light having a wave length of between approximately 4000 and 6000 Å. Accordingly, light influencing elements 58 and 102–110 are adapted to absorb or filter light having a wave length in that range. Thus, for example, light influencing element 58 may be adapted to absorb in the 4000–6000 Å range and fluorescent light having a wave length of, for example, 6000–7000 Å in response thereto. Alternatively, certain ones of the light influencing elements 102–110 may be adapted to absorb light having a wave length of between approximately 4,000 and 5,000 Å allowing light having a wave length of greater than about 5000 Å to pass therethrough (transmit) thus filtering out light of any other wavelength. Similarly, other light influencing elements may be adapted to allow light having a wavelength of approximately 5000 Å to pass through, filtering out all other wavelengths. In this way, it is possible to provide a display which emits both green and blue light color filter elements, and red light via fluorescing elements. All of this is disclosed in commonly assigned copending U.S. patent application Ser. No. 08/706,874 in the names of Shi, et al entitled multicolored organic electroluminescent display filed Sep. 3, 1996, the disclosure of which is enclosed herein by reference.

It may thus be appreciated that in a single, integral display device, one may provide information both in varying or dynamic fashion as well as static or iconic information. Such a display device has substantial advantages over the prior art in terms of ease of manufacturing, increased manufacturing yield and enhanced performance owing to the inherent advantages of organic electroluminescent display devices.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An organic electroluminescent information display device comprising:
    a display substrate having a surface;
    a spacer material disposed on the surface of the display substrate;
    a transparent conductive material disposed on the spacer material;
    an organic electroluminescent material disposed on the transparent conductive material;
    a plurality of display electrodes disposed on a first portion of the organic electroluminescent material for, in conjunction with the transparent conductive material and the organic electroluminescent material, forming a plurality of pixels of a dynamic display; and
    an icon electrode disposed on a second portion of the organic electroluminescent material for, in conjunction with the transparent conductive material and the organic electroluminescent material, forming a static display.

2. The organic electroluminescent information display device of claim 1 further comprising an influencing element disposed between the display substrate and the spacer material and in alignment with the icon electrode for influencing the color of the static display.

3. The organic electroluminescent information display device of claim 1 further comprising a plurality of influencing elements disposed between the display substrate and the spacer material, each one of the plurality of influencing elements in alignment with each one of the plurality of display electrodes for influencing the color of the dynamic display.

* * * * *